(12) United States Patent
Hill et al.

(10) Patent No.: US 11,669,747 B2
(45) Date of Patent: Jun. 6, 2023

(54) CONSTRAINING FUNCTION APPROXIMATION HARDWARE INTEGRATED WITH FIXED-POINT TO FLOATING-POINT CONVERSION

(71) Applicant: QUALCOMM Incorporated, San Diego, CA (US)

(72) Inventors: Rexford Alan Hill, San Diego, CA (US); Eric Wayne Mahurin, Austin, TX (US); Aaron Douglass Lamb, San Diego, CA (US); Albert Danysh, Austin, TX (US); Erich Plondke, Austin, TX (US); David Hoyle, Tideswell (GB)

(73) Assignee: Qualcomm Incorporated, San Diego, CA (US)

( * ) Notice: Subject to any disclaimer, the term of this patent is extended or adjusted under 35 U.S.C. 154(b) by 804 days.

(21) Appl. No.: 16/667,821

(22) Filed: Oct. 29, 2019

(65) Prior Publication Data
US 2020/0134475 A1 Apr. 30, 2020

Related U.S. Application Data

(60) Provisional application No. 62/752,931, filed on Oct. 30, 2018.

(51) Int. Cl.
*G06N 5/00* (2023.01)
*G06N 5/01* (2023.01)
(Continued)

(52) U.S. Cl.
CPC ............... *G06N 5/01* (2023.01); *G06F 17/17* (2013.01); *G06N 3/048* (2023.01); *G06N 3/08* (2013.01);
(Continued)

(58) Field of Classification Search
CPC ........ G06N 5/003; G06N 3/0481; G06N 3/08; G06N 3/088; G06N 3/0454; G06N 3/063; G06N 3/084; H03K 19/20; H03K 19/21; G06F 17/17; G06F 7/00; G06F 5/012; G06F 2207/4824; H03M 7/24; H03M 7/3059
(Continued)

(56) References Cited

U.S. PATENT DOCUMENTS 4,631,696 A 12/1986 Sakamoto
5,535,148 A 7/1996 Osborn et al.
(Continued)

OTHER PUBLICATIONS

Partial International Search Report—PCT/US2019/058883—ISA/EPO—dated Feb. 24, 2020.
(Continued)

*Primary Examiner* — Tan V Mai
(74) *Attorney, Agent, or Firm* — Seyfarth Shaw LLP

(57) ABSTRACT

A method of constraining data represented in a deep neural network is described. The method includes determining an initial shifting specified to convert a fixed-point input value to a floating-point output value. The method also includes determining an additional shifting specified to constrain a dynamic range during converting of the fixed-point input value to the floating-point output value. The method further includes performing both the initial shifting and the additional shifting together to form a dynamic, range constrained, normalized floating-point output value.

15 Claims, 10 Drawing Sheets

(51) Int. Cl.
　　　*G06N 3/08*　　　(2023.01)
　　　*H03M 7/24*　　　(2006.01)
　　　*G06F 17/17*　　　(2006.01)
　　　*G06N 3/048*　　　(2023.01)
　　　*H03K 19/21*　　　(2006.01)
　　　*H03K 19/20*　　　(2006.01)

(52) U.S. Cl.
　　　CPC .............. *H03M 7/24* (2013.01); *H03K 19/20* (2013.01); *H03K 19/21* (2013.01)

(58) Field of Classification Search
　　　USPC ................................... 708/204–205; 706/19
　　　See application file for complete search history.

(56) References Cited

U.S. PATENT DOCUMENTS

| | | |
|---|---|---|
| 6,671,796 B1 | 12/2003 | Sudharsanan et al. |
| 7,236,995 B2 | 6/2007 | Hinds |
| 9,110,713 B2 | 8/2015 | Wang |
| 2007/0258641 A1* | 11/2007 | Srinivasan ............. H04N 1/407 |
| | | 382/166 |

OTHER PUBLICATIONS

International Search Report and Written Opinion—PCT/US2019/058883—ISA/EPO—dated Jun. 24, 2020.

* cited by examiner

CONSTRAINING FUNCTION APPROXIMATION HARDWARE INTEGRATED WITH FIXED-POINT TO FLOATING-POINT CONVERSION

CROSS-REFERENCE TO RELATED APPLICATION

The present application claims the benefit of U.S. Provisional Patent Application No. 62/752,931, filed on Oct. 30, 2018, and titled "CONSTRAINING FUNCTION APPROXIMATION HARDWARE INTEGRATED WITH FIXED-POINT TO FLOATING-POINT CONVERSION," the disclosure of which is expressly incorporated by reference in its entirety.

BACKGROUND

Field

Certain aspects of the present disclosure generally relate to artificial neural networks and, more particularly, to the implementation of functions such as hyperbolic tangent (tanh) and sigmoid (sigm) functions.

Background

An artificial neural network, which may be composed of an interconnected group of artificial neurons (e.g., neuron models), is a computational device or represents a method performed by a computational device. These neural networks may be used for various applications and/or devices, such as internet protocol (IP) cameras, Internet of Things (IoT) devices, autonomous vehicles, and/or service robots.

Convolutional neural networks are a type of feed-forward artificial neural network. Convolutional neural networks may include collections of neurons that each have a receptive field and that collectively tile an input space. Convolutional neural networks (CNNs) have numerous applications. In particular, CNNs have broadly been used in the area of pattern recognition and classification.

Deep learning architectures, such as deep belief networks and deep neural networks (DNNs), are layered neural network architectures. In these layered neural network architectures, the output of a first layer of neurons becomes an input to a second layer of neurons, the output of a second layer of neurons becomes an input to a third layer of neurons, and so on. Deep neural networks may be trained to recognize a hierarchy of features and so they have increasingly been used in object recognition applications. Like convolutional neural networks, computation in these deep learning architectures may be distributed over a population of processing nodes, which may be configured in one or more computational chains. These multi-layered architectures may be trained one layer at a time and may be fine-tuned using back propagation.

Deep learning neural network layers may enable image recognition, object detection, and natural language processing. These features enable support for autonomous driving applications as well as content-aware camera processing. Deep convolutional neural networks (DCNs) have promising applications in emerging embedded, wearable, and Internet of Things (IoT) markets.

Although these deep neural network solutions achieve excellent results, their computational complexity can be prohibitively high. Additionally, training of the models may be challenging.

SUMMARY

A method of constraining data represented in a deep neural network is described. The method includes determining an initial shifting specified to convert a fixed-point input value to a floating-point output value. The method also includes determining an additional shifting specified to constrain a dynamic range during converting of the fixed-point input value to the floating-point output value. The method further includes performing both the initial shifting and the additional shifting together to form a dynamic, range constrained, normalized floating-point output value.

A circuit to constrain a dynamic range of data represented in a deep neural network is described. The circuit includes CLZ/CLO logic to count a number of leading zeros and/or a number of leading ones of a fixed-point input value. The circuit also includes a shift block configured to shift the fixed-point input value and mask logic. The circuit further includes control logic to control the shift block to convert the fixed-point input value to a floating-point output value according the number of leading zeros and/or the number of leading ones of the fixed-point input value. The control block controls the mask logic to constrain a dynamic range during converting of the fixed-point input value to the floating-point output value to form a dynamic, range constrained, normalized floating-point output value.

A circuit to constrain a dynamic range of data represented in a deep neural network is described. The circuit includes means for counting a number of leading zeros and/or a number of leading ones of a fixed-point input value. The circuit also includes a shift block configured to shift the fixed-point input value and mask logic. The circuit further includes control logic to control the shift block to convert the fixed-point input value to a floating-point output value according the number of leading zeros and/or the number of leading ones of the fixed-point input value. The control block controls the mask logic to constrain a dynamic range during converting of the fixed-point input value to the floating-point output value to form a dynamic, range constrained, normalized floating-point output value.

A method of implementing a full accumulator size to support arbitrary calculations with full precision is described. The method includes analyzing weights and activations of a trained neural network. The method also includes identifying bits of an accumulator that are not specified to achieve a predetermined dynamic range derived from analyzing weights and activations. The method further includes disabling accumulator hardware when processing an identified accumulator bit.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

Figure 1:
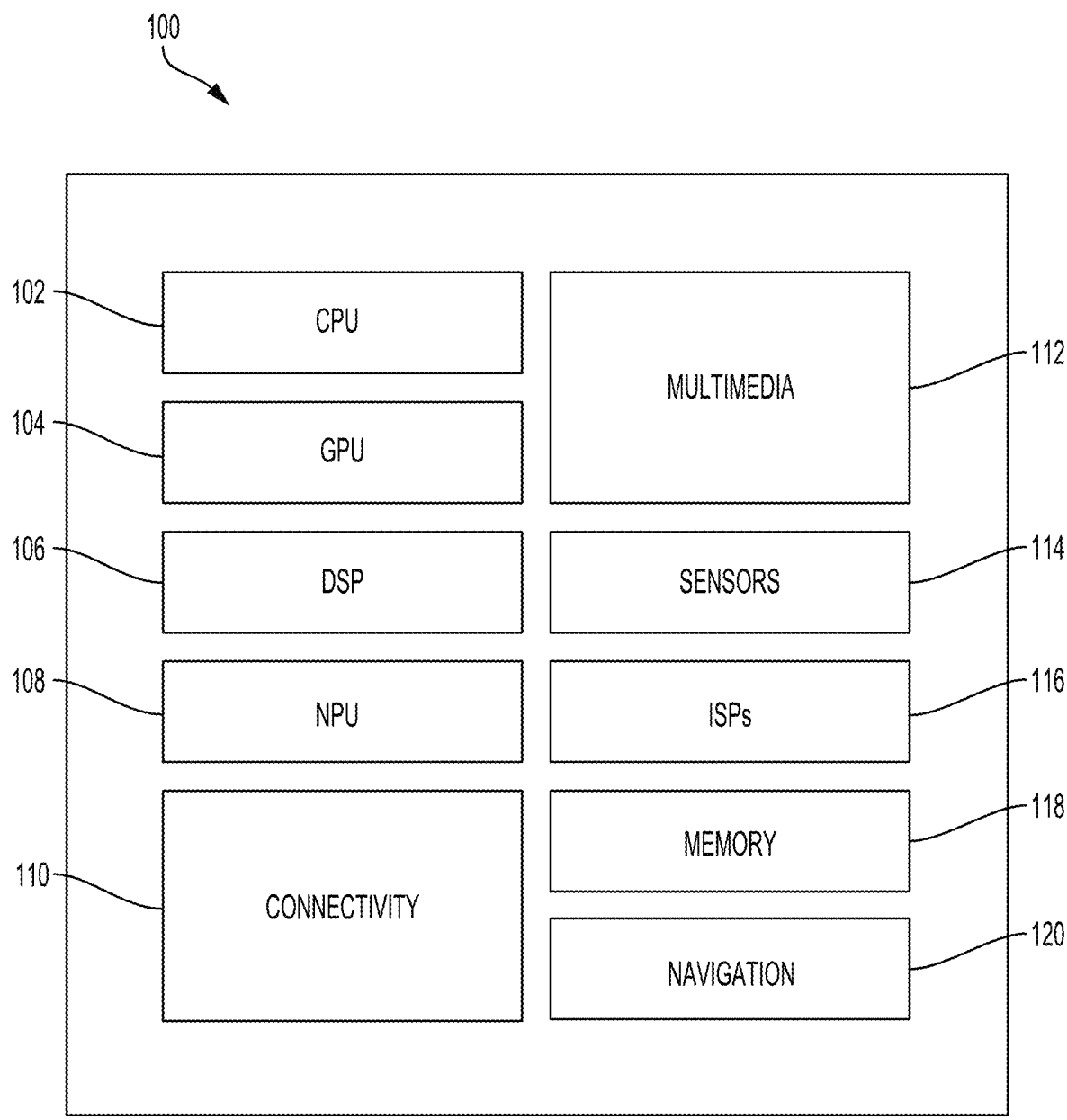
FIG. 1 illustrates an example implementation of designing a neural network using a system-on-a-chip (SOC), including a general-purpose processor, in accordance with certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

In operation, neural networks frequently contain layers that implement non-linear functions for mapping highly complex high dimensional data to lower latent space representations. For example, this mapping may include classifying images into categories or extracting semantic meaning from audio recordings of people speaking. In practice, designers frequently use a hyperbolic tangent (tanh) function to constrain a dynamic range (e.g., of the high dimensional data) symmetrically around a value of 0. In addition, a sigmoid (sigm) function may be used to constrain the dynamic range to positive numbers, symmetric around ½ the desired dynamic range (e.g. symmetric around ½) when the dynamic range is to be constrained to [0,1].

Difficulty arises when processing tanh and sigm functions in real-time hardware accelerators when implementing a neural network. The tanh and sigm functions are frequently approximated. This approximation may involve between 4 to 6 multiplications per sample (e.g., a $3^{rd}$ or $4^{th}$ order piecewise-polynomial approximation) for achieving a level of accuracy that does not degrade the outcome of a neural network inference. This can involve a significant amount of hardware because implementing multipliers is expensive. Additionally, a batch-processing nature of tiles within a layer of a neural network may involve a large throughput due to non-linear approximations (e.g., a large number of parallel implementations) for preventing a bottleneck in upstream calculations. The large throughput may also involve redundant storage, which is expensive in terms of both area and power.

The tanh and sigm functions have been used for dynamic range compression, especially where high-fidelity (such as audio) is involved for not disturbing the observer/listener. Deep neural networks, however, are different. For example, a neural network training process starts from noisy chaos generated from a sample of data, and iteratively orders the chaos as it deconstructs a multitude of data samples. Non-linear functions with continuous $1^{st}$ and $2^{nd}$ derivatives (e.g., continuous functions without sudden changes of slope) work best for first order and second order gradient descent algorithms. Frequently, the dynamic range of activations during inferences of trained networks settles neatly into the near-linear range of both tanh and sigm functions.

Acceptable distortions should not change a calculated output value during neural network inference. That is, distortions (that are not part of the training process) should not change the order of the probable outcomes, which would impact the accuracy of the inference. In the case of quantization, the added noise when reducing both weights and activations from a 32-bit floating-point representation to a 16-bit or 8-bit fixed-point approximation can be $2^{-16}$=0.002% (for 16-bit) to $2^{-8}$=0.4% (for 8-bit) of full-scale. Note that 8-bit quantization has been shown to be acceptable in many neural networks. With the advent of fine-tuning in these networks, accuracy degradation can be reduced below that of the random assignment of data between training and test groups.

Similarly, extremely simplistic dynamic range-constraining non-linear activation functions have arisen to address a non-linear calculation bottleneck. These non-linear activation functions, however, have not achieved an accuracy level of 'tanh', 'sigm', or other theoretical functions. For example, a rectified linear unit (ReLU) function, such as ReLU6, is a simple function that can have hard saturation points when outside a perfectly linear range and a trivial hardware implementation (e.g., 2 adders and 2 multiplexers (MUXes)). This function can be considered a simple piecewise-linear approximation to the 'sigm' function.

One aspect of the present disclosure is directed to a hardware-approximation of tanh or sigm functions integrated with fixed-point to floating-point conversion. The simplified hardware approximation may be provided at the expense of higher distortion and accuracy degradation, which may or may not be able to be partially rectified by fine-tuning. In another aspect of the present disclosure, approximation is used in training rather than in inference. This process enhances a simple non-linear function from a hardware implementation having continuous $1^{st}$ and $2^{nd}$ order derivatives with which to train the network in a way that fine-tuning is unnecessary and errors are reduced.

Activations in neural networks involve many computations of dot products of vectors ranging from a few elements to thousands of elements. These computations are typically implemented using a multiply-accumulate (MAC) operation, in which each pair of elements are multiplied together and added to a running accumulation. The vector elements are typically stored in a standard format, such as Institute of Electrical and Electronics Engineers (IEEE) 16-bit floating-point (FP16) format, having a well-defined maximum dynamic range. For the IEEE FP16 format, this ranges from approximately $2^{-24}$ to $2^{16}$. When multiplying two elements, the dynamic range is much larger (e.g., from $2^{-48}$ to $2^{32}$). Therefore, for full accuracy, an accumulator should be designed to handle a dynamic range at least that large. Supporting such a wide dynamic range is expensive in terms of silicon area and power, and is one of the key bottlenecks limiting high performance, low power neural network processing.

Most neural networks are trained with high precision 32-bit floating-point numbers, and some are now being trained with 16-bit floating-point numbers. Unfortunately, training systems and conventions usually normalize weights to a magnitude of less than 1.0, limiting the dynamic range of weights to be less than 2°. Additionally, if the distribution of weights of a trained neural network spans a large dynamic range, the contribution of small weights times activations to a dot product is overshadowed by the product of larger weights (e.g., those near 1.0) times activations. For this reason, most trained neural networks exhibit weight distributions with a minimum closer to $2^{-10}$.

Once a trained neural network model is deployed, the weights are static and can be analyzed just before deployment to determine the dynamic range. Moreover, the activations involved in the dot product computations of the trained neural network may also have a constrained dynamic range. Activation data is typically processed through a nonlinear operation such as tanh, with a range of (−1.0,1.0), sigmoid (0.0,1.0), ReLU6 [0.0,6.0], or ReLU1 [0,1.0]. This dynamic range is known before the network is deployed.

Using the dynamic range provided by the IEEE FP16 format, one aspect of the disclosure implements accumulators with a fixed-point representation storing enough bits to cover the $2^{-48}$ to $2^{32}$ dynamic range. This aspect of the present disclosure involves at least 81 bits, assuming a twos-complement fixed-point representation, with additional bits added to support a string of accumulations. Another aspect of the disclosure relates to software that analyzes the dynamic range of weights and activations before the network is deployed, so that the actual dynamic range specified in the accumulator is known.

One aspect of the disclosure would implement the full accumulator size to support arbitrary calculations with full precision. In that aspect, the hardware is configured to disable (e.g., clock gate) those bits of the accumulator that are not specified to achieve the dynamic range derived from the software analysis of weights and activations. All upstream and downstream logic attached to those accumulator bits is also disabled. This technique can save significant power versus enabling all accumulator bits and associated logic.

Another aspect of the disclosure consists of analyzing a number of trained neural network models to determine a smaller dynamic range that is suitable for all those networks, and then building the accumulator with only enough bits to support the largest accumulator dynamic range specified for those networks. In addition to saving even more power, this technique saves silicon area. Note that even in this case, a specific network can be analyzed to determine whether the dynamic range specific to that network is even more limited than the dynamic range of all networks analyzed so far. For such a network, additional bits of the hardware accumulator may be disabled, saving additional power.

FIG. 1 illustrates an example implementation of a system-on-a-chip (SOC) 100, which may include a central processing unit (CPU) 102 or multi-core CPUs configured to constrain a dynamic range during fixed-point to floating-point conversion in accordance with certain aspects of the present disclosure. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, or may be distributed across multiple blocks. Instructions executed at the CPU 102 may be loaded from a program memory associated with the CPU 102 or may be loaded from a memory block 118.

The SOC 100 may also include additional processing blocks tailored to specific functions, such as a connectivity block 110, which may include fifth generation (5G) connectivity, fourth generation long term evolution (4G LTE) connectivity, unlicensed Wi-Fi connectivity, USB connectivity, Bluetooth connectivity, and the like, and a multimedia processor 112 that may, for example, detect and recognize gestures. In one implementation, the NPU is implemented in the CPU, DSP, and/or GPU. The SOC 100 may also include a sensor processor 114, image signal processors (ISPs) 116, and/or navigation module 120, which may include a global positioning system.

The SOC 100 may be based on an ARM instruction set. In an aspect of the present disclosure, the instructions loaded into the NPU 108 may include code to constrain a dynamic range during fixed-point to floating-point conversion in deep neural networks (DNNs).

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of the feature vector components may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 2A:
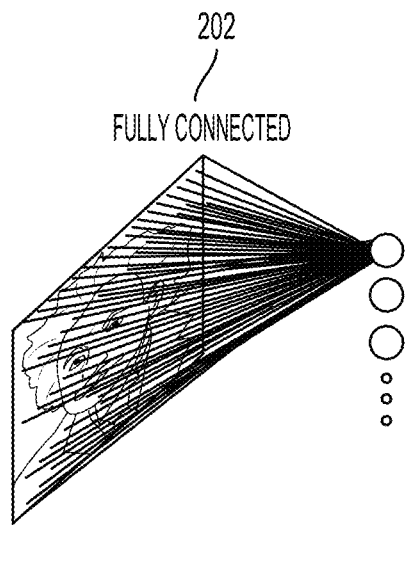
FIGS. 2A, 2B, and 2C are diagrams illustrating a neural network, in accordance with aspects of the present disclosure.
Figure 2B:
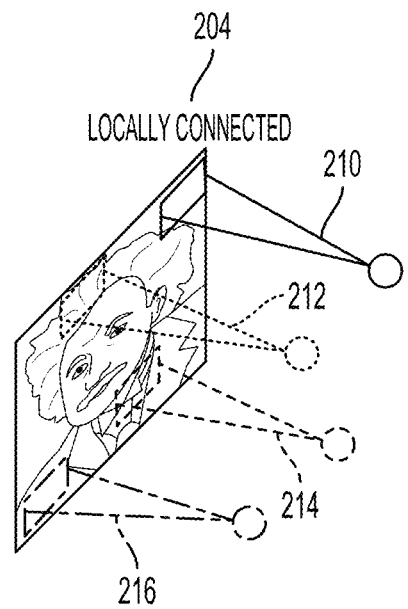

The connections between layers of a neural network may be fully connected or locally connected. FIG. 2A illustrates an example of a fully connected neural network 202. In a fully connected neural network 202, a neuron in a first layer may communicate its output to every neuron in a second layer, so that each neuron in the second layer will receive input from every neuron in the first layer. FIG. 2B illustrates an example of a locally connected neural network 204. In a locally connected neural network 204, a neuron in a first layer may be connected to a limited number of neurons in the second layer. More generally, a locally connected layer of the locally connected neural network 204 may be configured so that each neuron in a layer will have the same or a similar connectivity pattern, but with connections strengths that may have different values (e.g., 210, 212, 214, and 216). The locally connected connectivity pattern may give rise to spatially distinct receptive fields in a higher layer, because the higher layer neurons in a given region may receive inputs that are tuned through training to the properties of a restricted portion of the total input to the network.

Figure 2C:
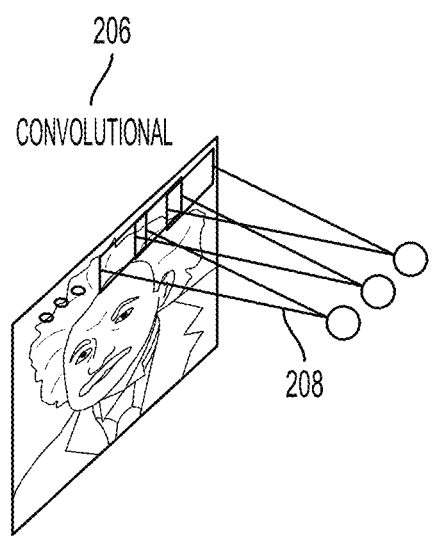

One example of a locally connected neural network is a convolutional neural network. FIG. 2C illustrates an example of a convolutional neural network 206. The convolutional neural network 206 may be configured such that the connection strengths associated with the inputs for each neuron in the second layer are shared (e.g., 208). Convolutional neural networks may be well suited to problems in which the spatial location of inputs is meaningful.

Figure 2D:
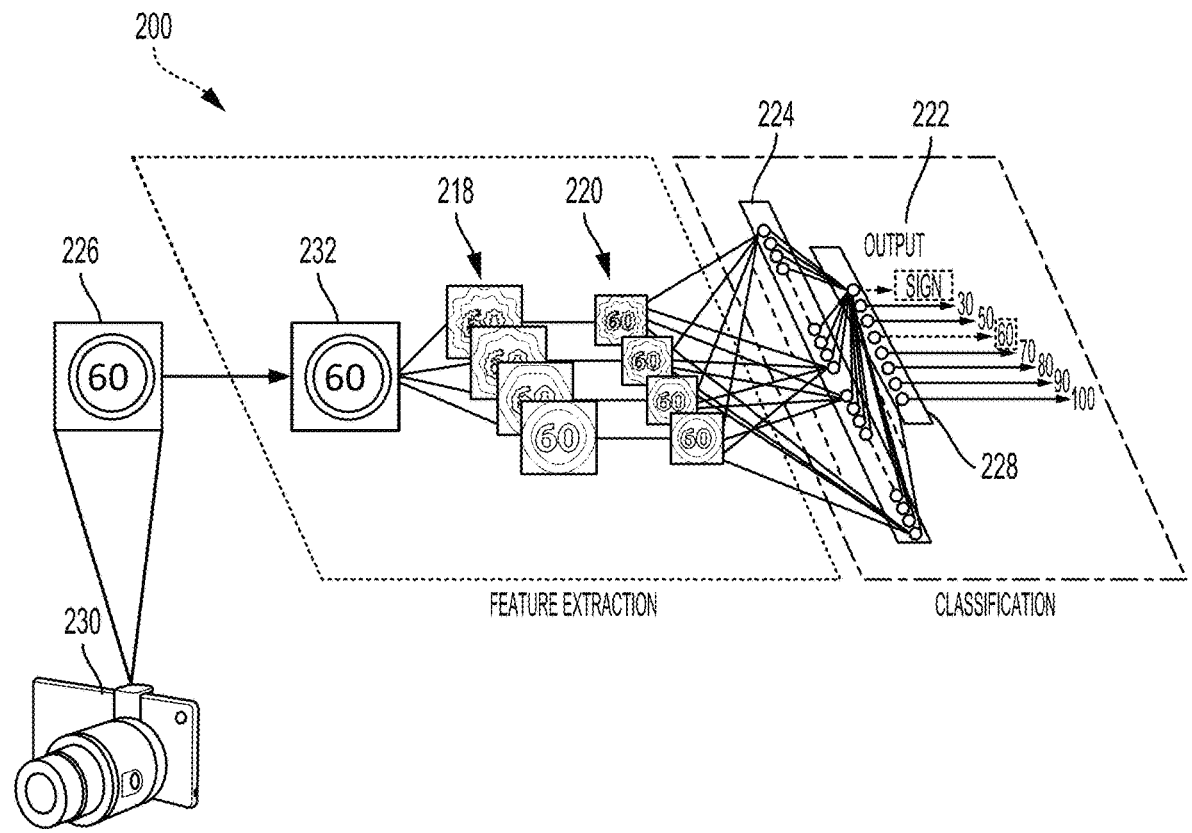
FIG. 2D is a diagram illustrating a neural network, in accordance with aspects of the present disclosure.

One type of convolutional neural network is a deep convolutional network (DCN). FIG. 2D illustrates a detailed example of a DCN 200 designed to recognize visual features from an image 226 input from an image capturing device 230, such as a car-mounted camera. The DCN 200 of the current example may be trained to identify traffic signs and a number provided on the traffic sign. Of course, the DCN 200 may be trained for other tasks, such as identifying lane markings or identifying traffic lights.

The DCN 200 may be trained with supervised learning. During training, the DCN 200 may be presented with an image, such as the image 226 of a speed limit sign, and a forward pass may then be computed to produce an output 222. The DCN 200 may include a feature extraction section and a classification section. Upon receiving the image 226, a convolutional layer 232 may apply convolutional kernels (not shown) to the image 226 to generate a first set of feature maps 218. As an example, the convolutional kernel for the convolutional layer 232 may be a 5×5 kernel that generates 28×28 feature maps. In the present example, because four different convolutional kernels were applied to the image 226 at the convolutional layer 232, four different feature maps are generated in the first set of feature maps 218. The convolutional kernels may also be referred to as filters or convolutional filters.

The first set of feature maps 218 may be subsampled by a max pooling layer (not shown) to generate a second set of feature maps 220. The max pooling layer reduces the size of the first set of feature maps 218. That is, a size of the second set of feature maps 220, such as 14×14, is less than the size of the first set of feature maps 218, such as 28×28. The reduced size provides similar information to a subsequent layer while reducing memory consumption. The second set of feature maps 220 may be further convolved via one or more subsequent convolutional layers (not shown) to generate one or more subsequent sets of feature maps (not shown).

In the example of FIG. 2D, the second set of feature maps 220 is convolved to generate a first feature vector 224. Furthermore, the first feature vector 224 is further convolved to generate a second feature vector 228. Each feature of the second feature vector 228 may include a number that corresponds to a possible feature of the image 226, such as "sign," "60," and "100." A softmax function (not shown)

may convert the numbers in the second feature vector 228 to a probability. As such, an output 222 of the DCN 200 is a probability of the image 226 including one or more features.

In the present example, the probabilities in the output 222 for "sign" and "60" are higher than the probabilities of the others of the output 222, such as "30," "40," "50," "70," "80," "90," and "100". Before training, the output 222 produced by the DCN 200 is likely to be incorrect. Thus, an error may be calculated between the output 222 and a target output. The target output is the ground truth of the image 226 (e.g., "sign" and "60"). The weights of the DCN 200 may then be adjusted so the output 222 of the DCN 200 is more closely aligned with the target output.

To adjust the weights, a learning algorithm may compute a gradient vector for the weights. The gradient may indicate an amount that an error would increase or decrease if the weight were adjusted. At the top layer, the gradient may correspond directly to the value of a weight connecting an activated neuron in the penultimate layer and a neuron in the output layer. In lower layers, the gradient may depend on the value of the weights and on the computed error gradients of the higher layers. The weights may then be adjusted to reduce the error. This manner of adjusting the weights may be referred to as "back propagation" as it involves a "backward pass" through the neural network.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level. After learning, the DCN may be presented with new images (e.g., the speed limit sign of the image 226) and a forward pass through the network may yield an output 222 that may be considered an inference or a prediction of the DCN.

Deep belief networks (DBNs) are probabilistic models comprising multiple layers of hidden nodes. DBNs may be used to extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feed-forward and shared connections of DCNs may be exploited for fast processing. The computational burden of a DCN may be much less, for example, than that of a similarly sized neural network that comprises recurrent or feedback connections.

The processing of each layer of a convolutional network may be considered a spatially invariant template or basis projection. If the input is first decomposed into multiple channels, such as the red, green, and blue channels of a color image, then the convolutional network trained on that input may be considered three-dimensional, with two spatial dimensions along the axes of the image and a third dimension capturing color information. The outputs of the convolutional connections may be considered to form a feature map in the subsequent layer 318 and 320, with each element of the feature map (e.g., 320) receiving input from a range of neurons in the previous layer (e.g., 318) and from each of the multiple channels. The values in the feature map may be further processed with a non-linearity, such as a rectification, max(0,x). Values from adjacent neurons may be further pooled, which corresponds to down sampling, and may provide additional local invariance and dimensionality reduction. Normalization, which corresponds to whitening, may also be applied through lateral inhibition between neurons in the feature map.

The performance of deep learning architectures may increase as more labeled data points become available or as computational power increases. Modern deep neural networks are routinely trained with computing resources that are thousands of times greater than what was available to a typical researcher just fifteen years ago. New architectures and training paradigms may further boost the performance of deep learning. Rectified linear units may reduce a training issue known as vanishing gradients. New training techniques may reduce over-fitting and thus enable larger models to achieve better generalization. Encapsulation techniques may abstract data in a given receptive field and further boost overall performance.

Figure 3:
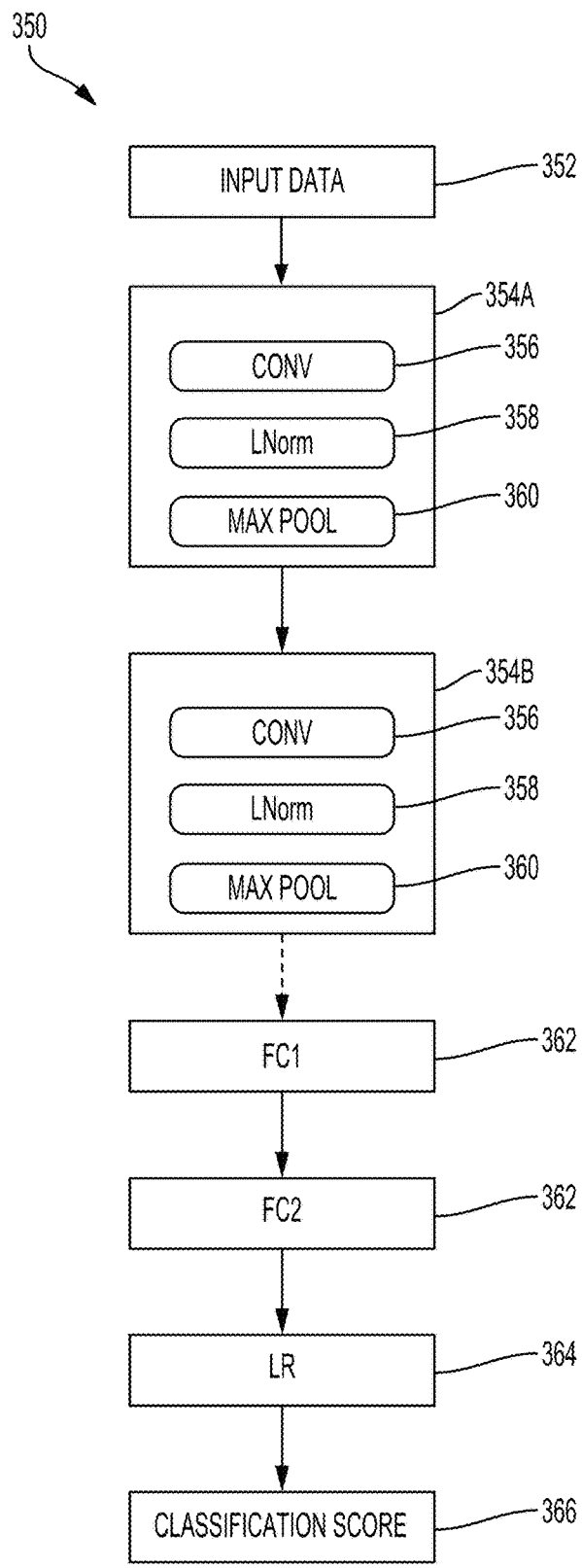
FIG. 3 is a block diagram illustrating a deep convolutional network (DCN), in accordance with aspects of the present disclosure.

FIG. 3 is a block diagram illustrating a deep convolutional network 350. The deep convolutional network 350 may include multiple different types of layers based on connectivity and weight sharing. As shown in FIG. 3, the deep convolutional network 350 includes the convolution blocks 354A, 354B. Each of the convolution blocks 354A, 354B may be configured with a convolution layer (CONV) 356, a normalization layer (LNorm) 358, and a max pooling layer (MAX POOL) 360.

The convolution layers 356 may include one or more convolutional filters, which may be applied to the input data to generate a feature map. Although only two of the convolution blocks 354A, 354B are shown, the present disclosure is not so limiting, and instead, any number of the convolution blocks 354A, 354B may be included in the deep convolutional network 350 according to design preference. The normalization layer 358 may normalize the output of the convolution filters. For example, the normalization layer 358 may provide whitening or lateral inhibition. The max pooling layer 360 may provide down sampling aggregation over space for local invariance and dimensionality reduction.

The parallel filter banks, for example, of a deep convolutional network may be loaded on a CPU 102 or GPU 104 of an SOC 100 to achieve high performance and low power consumption. In alternative embodiments, the parallel filter banks may be loaded on the DSP 106 or an ISP 116 of an SOC 100. In addition, the deep convolutional network 350 may access other processing blocks that may be present on the SOC 100, such as sensor processor 114 and navigation module 120, dedicated, respectively, to sensors and navigation.

The deep convolutional network 350 may also include one or more fully connected layers 362 (FC1 and FC2). The deep convolutional network 350 may further include a logistic regression (LR) layer 364. Between each layer 356, 358, 360, 362, 364 of the deep convolutional network 350 are weights (not shown) that are to be updated. The output of each of the layers (e.g., 356, 358, 360, 362, 364) may serve as an input of a succeeding one of the layers (e.g., 356, 358, 360, 362, 364) in the deep convolutional network 350 to learn hierarchical feature representations from input data 352 (e.g., images, audio, video, sensor data and/or other input data) supplied at the first of the convolution blocks 354A. The output of the deep convolutional network 350 is a classification score 366 for the input data 352. The classification score 366 may be a set of probabilities, where each probability is the probability of the input data including a feature from a set of features.

Figure 4:
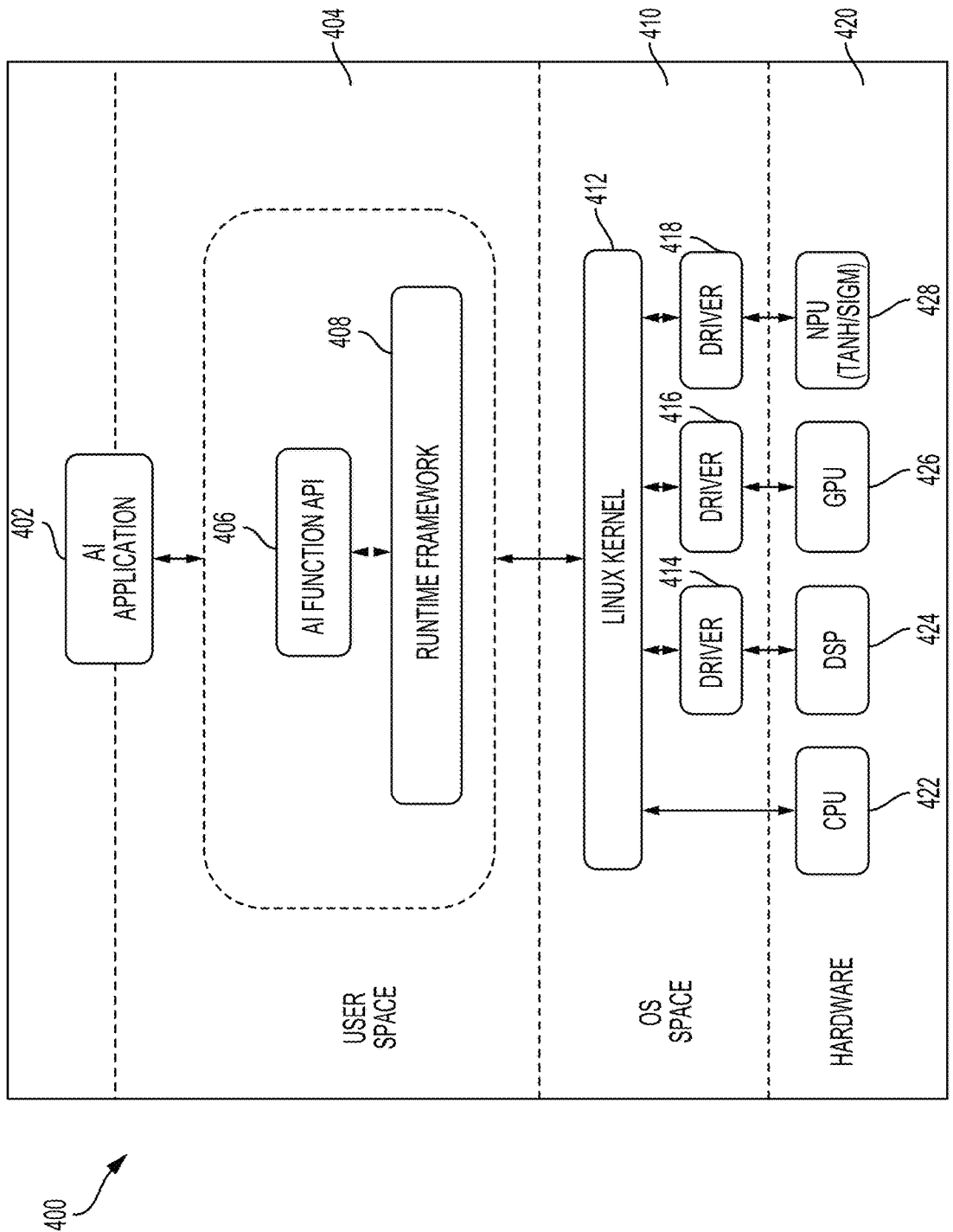
FIG. 4 is a block diagram illustrating a software architecture that may modularize artificial intelligence (AI) functions, in accordance with aspects of the present disclosure.

FIG. 4 is a block diagram illustrating a software architecture 400 that may modularize artificial intelligence (AI) functions. Using the software architecture 400, applications may be designed that may cause various processing blocks of an SOC 420 (for example a CPU 422, a DSP 424, a GPU 426, and/or an NPU 428) to constrain a dynamic range of fixed-point to floating-point conversion during run-time operation of an AI application 402, according to aspects of the present disclosure.

The AI application 402 may be configured to call functions defined in a user space 404 that may, for example, provide for the detection and recognition of a scene indicative of the location in which the device currently operates. The AI application 402 may, for example, configure a microphone and a camera differently depending on whether the recognized scene is an office, a lecture hall, a restaurant, or an outdoor setting such as a lake. The AI application 402 may make a request to compiled program code associated with a library defined in an AI function application programming interface (API) 406. This request may ultimately rely on the output of a deep neural network configured to provide an inference response based on video and positioning data, for example.

A run-time engine 408, which may be compiled code of a runtime framework, may be further accessible to the AI application 402. The AI application 402 may cause the run-time engine, for example, to request an inference at a particular time interval or triggered by an event detected by the user interface of the application. When caused to provide an inference response, the run-time engine may in turn send a signal to an operating system in an operating system (OS) space 410, such as a Linux Kernel 412, running on the SOC 420. The operating system, in turn, may constrain a dynamic range during fixed-point to floating-point conversion in computations performed on the CPU 422, the DSP 424, the GPU 426, the NPU 428, or some combination thereof. The CPU 422 may be accessed directly by the operating system, and other processing blocks may be accessed through a driver, such as a driver 414, 416, or 418 for, respectively, the DSP 424, the GPU 426, or the NPU 428. In the exemplary example, the deep neural network may be configured to run on a combination of processing blocks, such as the CPU 422, the DSP 424, and the GPU 426, or may be run on the NPU 428.

When calculating neural network inferences, a convolution layer (resulting in a normalization to a floating-point number) may include hardware to calculate the number of repeated MSBs (most significant bits). These MSBs may control a hardware structure that extracts a desired window of bits (e.g., a shifter). This may include conversions from fixed-point to floating-point, or post-ALU (arithmetic logic unit) operation normalizations in floating-point, etc. While typical implementations of floating-point accumulations occur one at a time (e.g., 1 MAC (multiply-accumulate) for each cycle) and normalize back to a standard floating-point number, the long dot-product nature of the calculations in a deep neural network (DNN) imply gains in dynamic range from multiple MACs occurring prior to normalization. As such, running fixed-point accumulations with a single, final normalization are indicated, though rare, in hardware prior to recent DNN hardware.

Using normalization hardware configured for converting from a large fixed-point accumulated value, a piecewise-linear approximation is designed to implement either 'tanh' or 'sigm' with a reduced amount of additional data-path and control hardware. The number of repeated MSBs (in addition to any representation of the exponent) provide control information that defines boundaries between which to apply different calculations. Mathematically, a shifter performs multiplications by a single, chosen power-of-2 value (specifically, negative powers-of-2). Thus, an additional multiplication by a power-of-2 may be leveraged in conjunction with a normalization process.

Further, knowing that an "excessive" shift during normalization results in zeroes in the MSBs of a mantissa, the ability to add values to the mantissa can be performed with a bit-width wide set of logical-OR gates if the offset and post-shifted mantissa are known to have mutually exclusive non-zero bits. That is, adding in a way in which carry-outs are never generated is ensured. Power-of-2 subtractions are performed with AND gates.

Additionally, where negative versions of a value may be involved, a simple ones complement can be formed from negating each bit as opposed to a complete twos complement negation that involves a bit-width of half-adders circuits.

The above-described hardware can support remapping given powers-of-2 ranges of the input to different powers-of-2 ranges, or defined powers-of-2 ranges that are a subset within another power-of-2 range. In the case of approximating 'tanh', leaving alone all except the largest power-of-2 range of the desired output (e.g., linear range) means for a tanh function producing values [−1,1], we choose [−0.5, +0.5] to be an unaffected (linear) range. Then, compression or remapping of the power-of-2 sub-range [min_input,−0.5] to [−1, −0.5] and [0.5, max_input] to [0.5,1] is performed. One implementation, which appears to match tanh very closely, is to give each subsequent power-of-2 of the input to ½ of the remaining, unused dynamic range not yet mapped to. For example, mapping input values [0.5,1.0] to [0.5,0.75] involves an extra power-of-2 shifting down (e.g., multiply by ½) of the mantissa bits (after AND masking the MSB with a 0), then OR-ing a bit to return the 0.5 offset. In actuality, this final OR-ing is implied through the use of the implied-1-MSB when in floating-point format.

Continuing on, an input range of [1.0, 2.0] is mapped to [0.75,0.875], [2.0, 4.0] to [0.875, 0.9375], etc. Generally, an input range of $[2^a, 2^{a+1}]$ may be mapped to an output range of $[1-½^{a+2}, 1-½^{a+3}]$. For 'tanh', negative values have the same corresponding negative range mapping due to the symmetry of the sign/magnitude notation.

Figure 5:
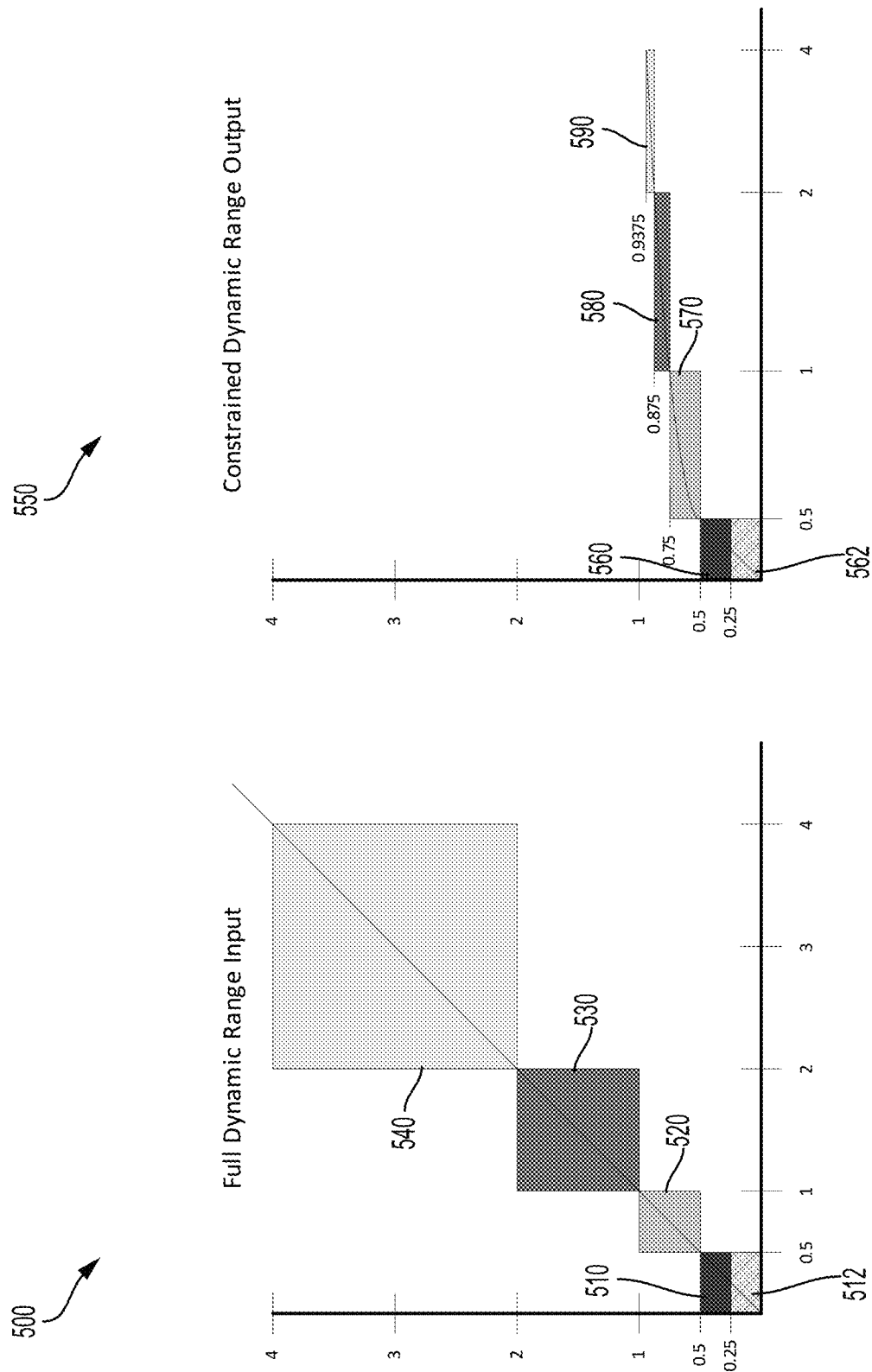
FIGS. 5A and 5B are graphs illustrating constraining of a dynamic range of data represented in deep neural networks, according to aspects of the present disclosure.

FIGS. 5A and 5B are graphs illustrating constraining of a dynamic range during fixed-point to floating-point conversion in deep neural networks, according to aspects of the present disclosure. FIG. 5A is a graph 500, illustrating a full dynamic range input for fixed-point to floating-point conversion. FIG. 5B is a graph 550 illustrates mapping from input to output assuming a tanh function saturating at +1 and −1 (negative values are the odd-symmetry image around the origin of the positive values, not shown). It should be recognized that the change in the scale of the x-range is not of significance. That is, the x-scale of the output graph is arranged based upon the ability to draw a curve in a tool incapable of controlling the curvature of the arc.

In FIG. 5A, the graph 500, shows a solid box 510 in the linear range (e.g., y=x), representing input (and output) values between $1.0000000000*2^{-2}$ and $1.1111111111*2^{-2}$. The cross-hatched box 512 below the solid box 510 represents all values with all exponents of −5 and lower and is also in the linear range. As shown in FIG. 5B, a solid box 560 corresponds to the solid box 510 of FIG. 5A, and a cross-hatched box 562 corresponds to the cross-hatched box 512 of FIG. 5A. As should be recognized, a mapping of the solid boxes 510, 560 and cross-hatched boxes 512, 562 is the same between FIGS. 5A and 5B. As shown in the graph 550 of FIG. 5B, a mapping algorithm maps each subsequent exponent's range to ½ of the remaining unused portion of the range, asymptotically approaching y=1 in the constrained dynamic output range.

In this aspect of the present disclosure, a box 520 (e.g., input values $1.0000 \ldots *2^{-1}$ to $1.1111 \ldots *2^{-1}$ and mapped to output values $1.00000 \ldots *2^{-1}=0.5$ and $1.01111 \ldots *2^{-1} \approx 0.75$) in FIG. 5A corresponds to a box 570 in FIG. 5B. The box 520 of FIG. 5A is reduced in height by a factor of 2 (mantissa shifted by an extra 1-bit giving the '0') and gives a 0.5 offset, which comes from the implied '1' in the MSB and exponent (e.g., $1.0*2^{-1}=0.5$) when mapped to the box 570 of FIG. 5B. A box 530 (e.g., input values $1.0000 \ldots *2^{0}$ to $1.1111 \ldots *2^{0}$ and mapped to output values $1.100000 \ldots *2^{-1}=0.75$ and $1.101111 \ldots *2^{-1} \approx 0.875$) in FIG. 5A corresponds to a box 580 in FIG. 5B. The box 530 of FIG. 5A is reduced in height by a factor of 8 (e.g., mantissa bits shifted by an extra 2 locations and exponent reduced by 1) when mapped to the box 580 of FIG. 5B. In this example, a '1' adds an additional offset of 0.25, as $1.1*2^{-1}=0.5+0.25=0.75$.

As further illustrated in FIGS. 5A and 5B, a box 540 (e.g., input values $1.0000 \ldots *2^{0}$ to $1.1111 \ldots *2^{0}$ are mapped to output values $1.1100000 \ldots *2^{-1}=0.75$ and $1.1101111 \ldots *2^{-1} \approx 0.875$) in FIG. 5A corresponds to a box 590 in FIG. 5B. The box 540 of FIG. 5A is changed by a factor of 8 (extra 3-bits) when mapped to the box 590 of FIG. 5B. In all cases, the '0' came from the excess shifting. The '1' is also from excess shift locations, but subsequently set to '1' using the OR mask. The '1' of the input is AND masked to 0, but re-appears in the output due to the implied 1 in the MSB nature of floating-point format.

Figure 6:
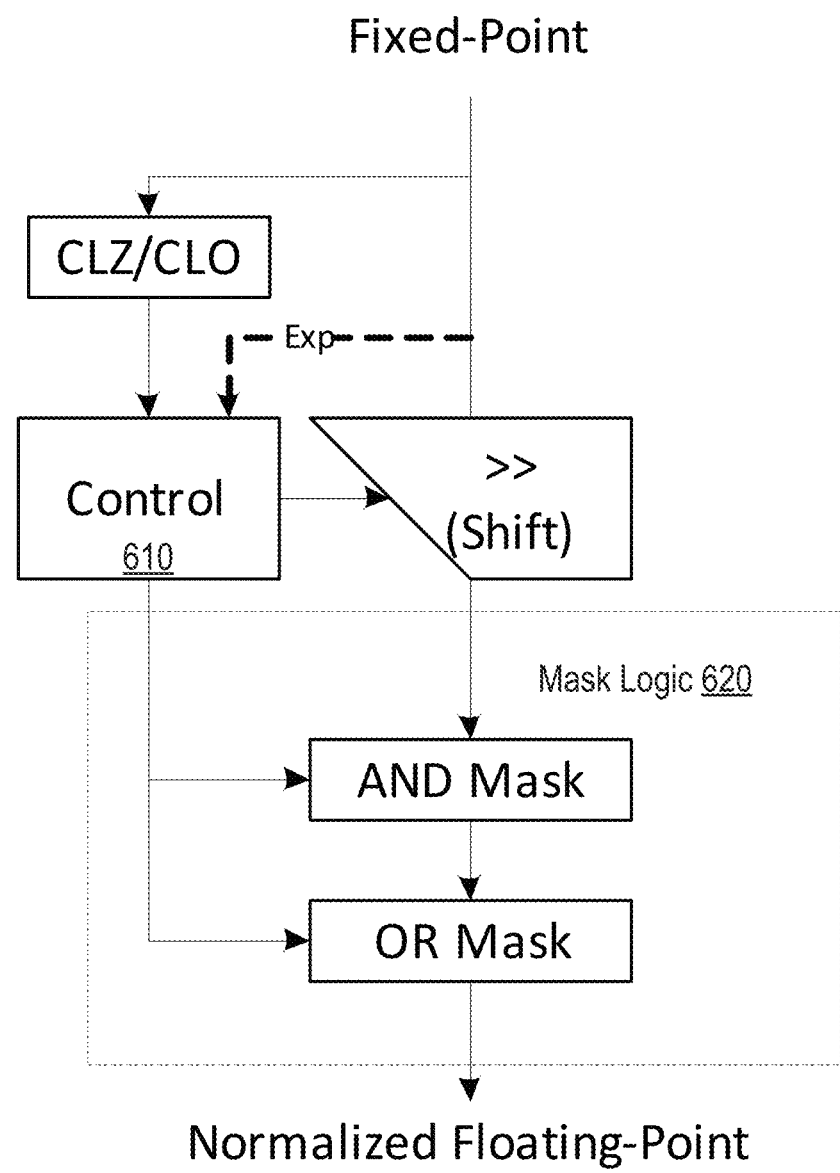
FIG. 6 is a block diagram illustrating a circuit configured to normalize fixed-point to floating-point converted numbers in deep neural networks, according to aspects of the present disclosure.

FIG. 6 is a block diagram illustrating a circuit 600 configured to normalize fixed-point to floating-point converted numbers in deep neural networks, according to aspects of the present disclosure. In this configuration, the circuit 600 receives a fixed-point input value. The fixed-point input value is fed to a first block (e.g., a count leading zeros (CLZ) or count leading one (CLO) block (CLZ/CLO logic). An output from the CLZ/CLO logic and an exponent (Exp) value are fed to a control logic 610. The CLZ/CLO logic is configured to count a number of leading zeros and/or a number of leading ones of the fixed-point input value. The output from the CLZ/CLO logic provides control information for controlling a shift block (Shift). This control information from the control logic 610 is fed a mask logic 620 to compute a normalized floating-point output value. In this configuration, the mask logic 620 includes a logical-AND mask (AND mask) and a logical-OR mask (OR mask). The fixed-point input value is processed through the shift block, the AND mask, and the OR Mask of the mask logic 620 to the normalized floating-point output value.

The circuit 600 involves a small amount of additional hardware, much less than adding a multiplier. The circuit 600 achieves an accuracy versus tanh with a maximum error of 4% of the dynamic range. Nevertheless, the majority of the error comes from increasing the linearity in the range [−0.5, 0.5], and changing the speed and exact location of the roll-off. Theoretically, a smooth curve fit to the values generated by the circuit 600 could be created (e.g., via Matlab's polyfit, spline, etc.) so that a modified neural network layer could be designed with which the neural network may be trained or re-trained. In this configuration, the circuit 600 produces significantly less error (e.g., max ~0.5% of the dynamic range) at inference-time.

As an example, suppose an approximation to tanh is implemented in FP16 (16-bit floating-point, with 1 sign bit, 5 exponent bits, and 10 fraction bits (e.g., mantissa)). Suppose the saturation level is chosen to be (in binary) $1.1111111111*2^{12}$. If the fixed-point input of circuit 600 receives an input value of $1.0110010101*2^{10}$, the output would be identical to input because the exponent '10' is less than '12'. On the other hand, if the same mantissa (or fraction bits) but exponent of '12' is received, $1.0110010101*2^{12}$, the desired output would be $1.0011001010*2^{12}$. Note the extra '0' inserted immediately after the binary point. In this case, the raw fixed-point input might be 000010110010101xxxxxxxx (where 'x' is a 'don't care' value). The CLZ/CLO logic would indicate '4' for the number of leading 0's. The control logic 610 would translate this to '12' as the final exponent.

Recognizing this to be the power-of-2 range where saturation occurs, in this example, the control logic 610 instructs the shift block to shift 9 bits instead of 8 (note there are 8 x's in this example). The 11 LSBs (least significant bits) after the 9-bit shift would then be 01011001010. The AND Mask of the mask logic 620 would mask the first 1, giving the intermediate values of 00011001010. The nature of floating-point is that the MSB is implied to be a 1, so when the 10-LSBs are saved to the final floating-point format, the fraction bits are 0011001010 with exponent representing 12, thus representing the value $1.0011001010*2^{12}$.

Continuing with a larger-value example, an input of $1.0110010101*2^{13}$, being in the next power-of-2 input range (e.g., any input with exponent of '13'), the control logic 610 would ensure this maps to the subrange between $1.1000000000*2^{12}$ (being the next largest output above any input with an exponent of '12') and $1.1011111111*2^{12}$. As such, the raw fixed-point input of 00010110010101xxxxxxxx would be right-shifted by 10 bits, to where the remaining 11 bits on the right would be 00101100101. Now the AND Mask of the mask logic 620 would zero-out the $3^{rd}$ bit leaving 00001100101. The OR Mask of the mask logic 620 would now be employed to 'add' the sub-range offset, giving the intermediate value of 01001100101. Now with fractional-only bits of 1001100101 and implied '1' of floating-point notation in the MSB, the output value would be $1.1001100101*2^{12}$. Alternately, if the input had been $1.1111111111*2^{13}$ (being the maximum mantissa allowable for exponent of '13'), the corresponding output value would be $1.1011111111*2^{12}$.

If the technique of training with the approximation function is not used, a more accurate approximation to tanh can be achieved with only slightly more hardware. The power-of-2 ranges can be subdivided further using just 1 additional bit of information from the input for control. While the shifter as a power-of-2 multiplier has already been fully utilized, adding a fraction (¼ or ½) of the post-shifted value (or its 1's complement to subtract) opens up effective filter coefficient values of 0.75, 1.0, 1.25, 1.5 times any power of 2. This provides a greater selection of slopes for the lines for sub-range remapping. With these additions, the error can drop to slightly less than 1%, for example, as shown in FIG. 7.

Figure 7:
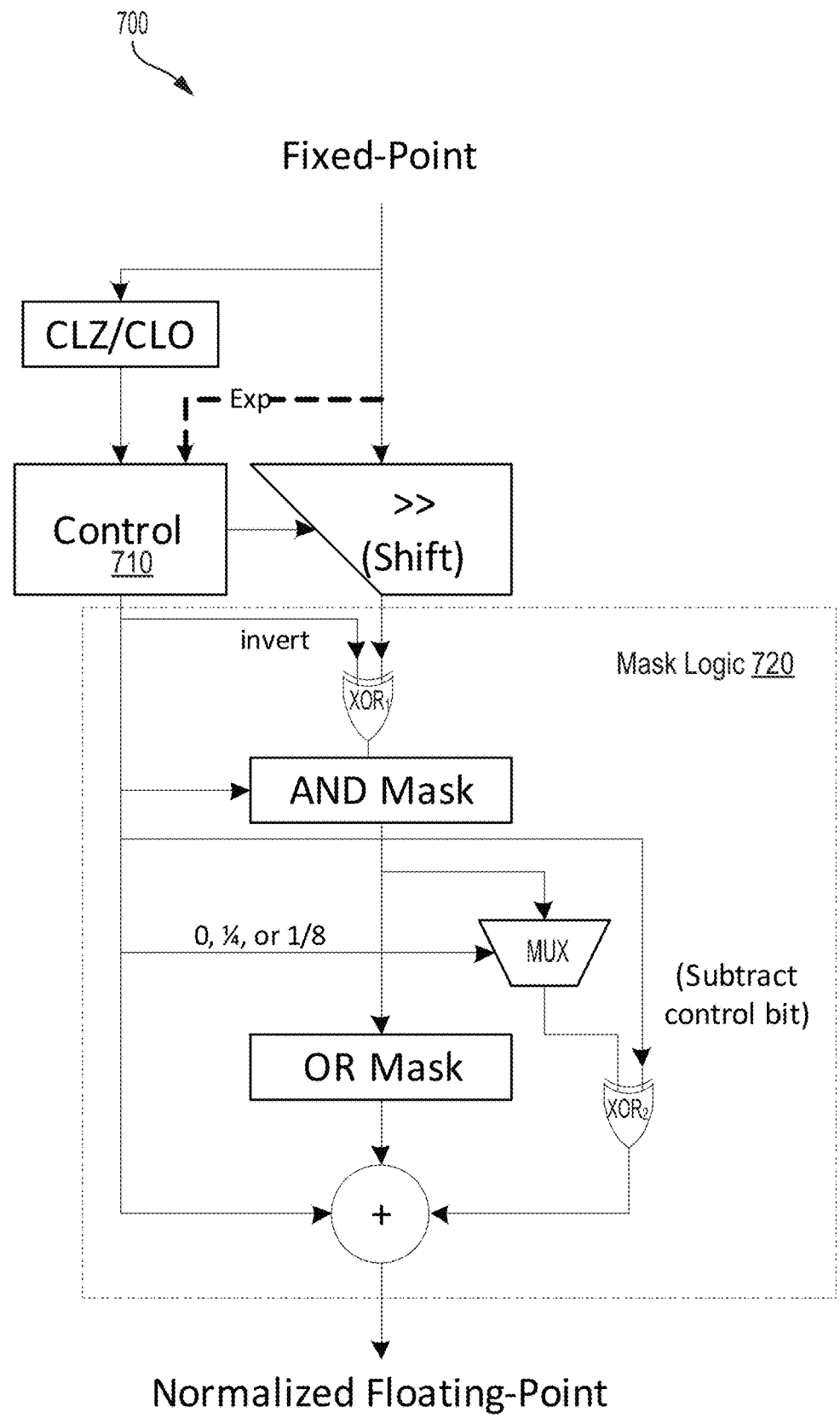
FIG. 7 is a block diagram illustrating a circuit configured to normalize fixed-point to floating-point converted numbers in deep neural networks, according to further aspects of the present disclosure.

FIG. 7 is a block diagram illustrating a circuit 700 configured to normalize a fixed-point value during conversion to a normalized floating-point value in a deep neural network, according to aspects of the present disclosure. This configuration is similar to the configuration shown in FIG. 6, in which the circuit 700 also receives the fixed-point input value. The fixed-point input value is fed to the CLZ/CLO logic. An output from the CLZ/CLO logic and an exponent (Exp) value are fed to a control logic 710. The output from the CLZ/CLO logic provides control information for controlling the shift block. This control information from the control logic 710 is fed to a logical-AND mask (AND mask) and a logical-OR mask (OR mask) of a mask logic 720 to compute the normalized floating-point output value.

The circuit 700 is configured to generate <1% error compared to tanh by configuring the mask logic 720 to include an adder (+), a 2-input (e.g., 0, ¼, or ⅛ and mask output) AND/OR (e.g. a multiplexer (MUX) with zeroing ability), and a bit width-set of exclusive-OR (XOR) logic gates (e.g., a first XOR gate ($XOR_1$) and a second XOR gate ($XOR_2$)). The fixed-point input value is processed through the shift block, a first XOR gate $XOR_1$, the AND Mask, and the OR mask, and the second XOR gate $XOR_2$, with output processed through the adder (+) to the normalized floating-point output value. Overall this configuration of the circuit 700 is less than the cost of adding a single multiplier and therefore quite efficient.

The same techniques can be applied with slightly different control for the implementation of 'sigm' with similar accuracy. Having already added the ½ offset to the input normalized to an expected, compressed output range [0,1], the control logic 710 would perform similar compression by shifting and offsetting on the high-end as done for tanh, as illustrated in the circuit 600 of FIG. 6. The control logic 710 would also re-map small positive input values of the range [0,0.25] to the new range [0.125,0.25]. All remaining negative input values would compress into [0,0.125] with shift values corresponding to the exponent values, though here the fraction bits output by the shift block would be inverted to obtain the 1's complement. The control logic 710 implements a new function of sign and exponent to choose new AND mask, OR mask, and shift values. A process for constraining a dynamic range of fixed-point to floating-point conversion in neural network layers is shown in FIG. 8.

Figure 8:
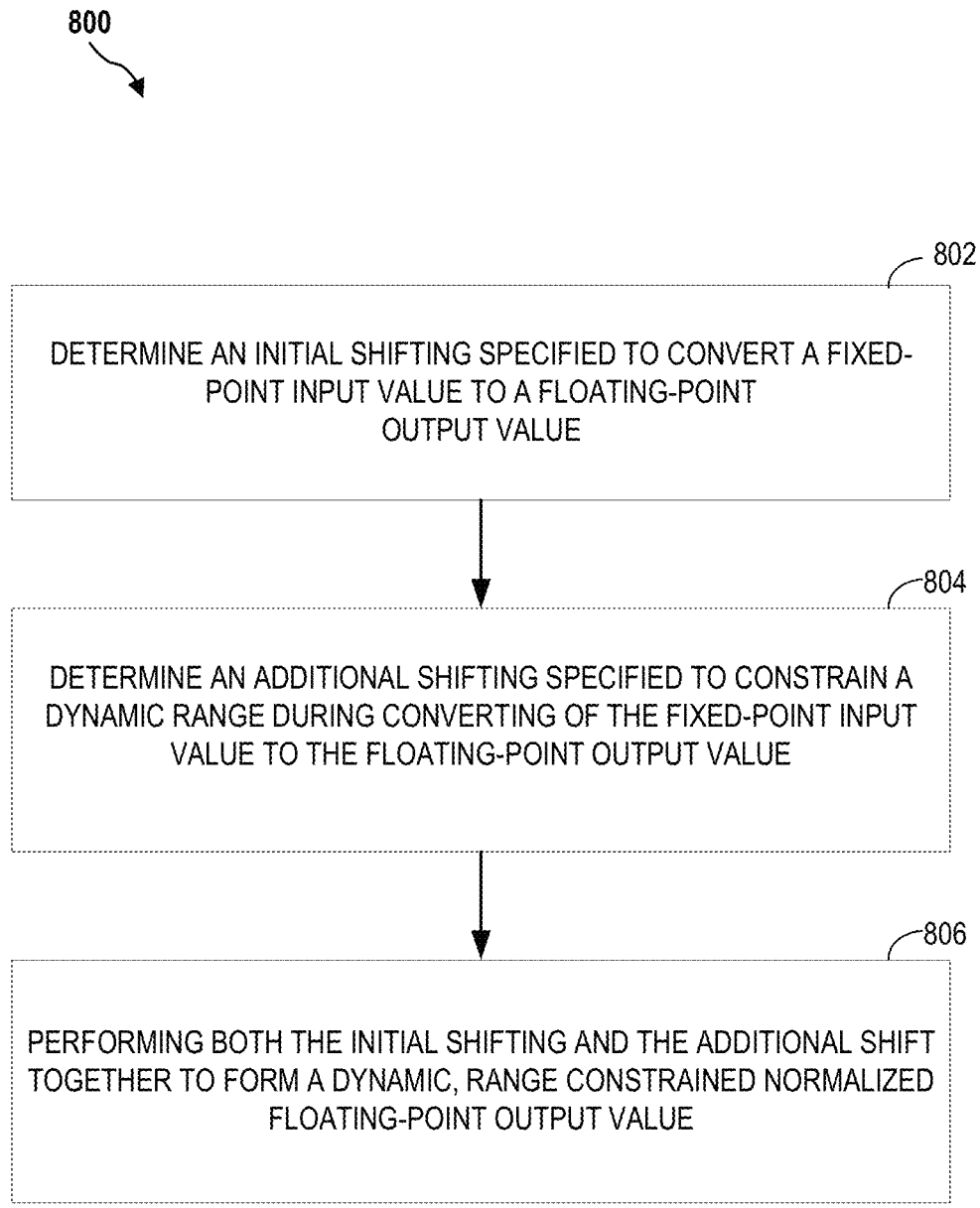
FIG. 8 illustrates a method of constraining data represented in a deep neural network, in accordance with aspects of the present disclosure.

FIG. 8 illustrates a method of constraining data represented in a deep neural network, in accordance with aspects of the present disclosure. A method 800 begins at block 802, an initial shifting specified to convert a fixed-point input value to a floating-point output value is determined. For example, as shown in FIGS. 6 and 7, the circuit 600 and the circuit 700 each receive a fixed-point input value that is eventually converted to a normalized floating-point output value. At block 804, an additional shifting specified to constrain a dynamic range during converting of the fixed-point input value to the floating-point output value is determined. A block 806, both the initial shifting and the additional shifting are performed together to form a dynamic, range constrained, normalized floating-point output value.

For example, as shown in FIGS. 6 and 7, control information is determined from the fixed-point input value by the CLZ/CLO logic. This control information is provided to the control logic, which controls a shift block configured to shift the fixed-point input values as part of an initial shifting. This control information is also provided to mask logic to process the output value from the shift block to perform the additional shifting to form a dynamic, range constrained, normalized floating-point output value.

Figure 9:
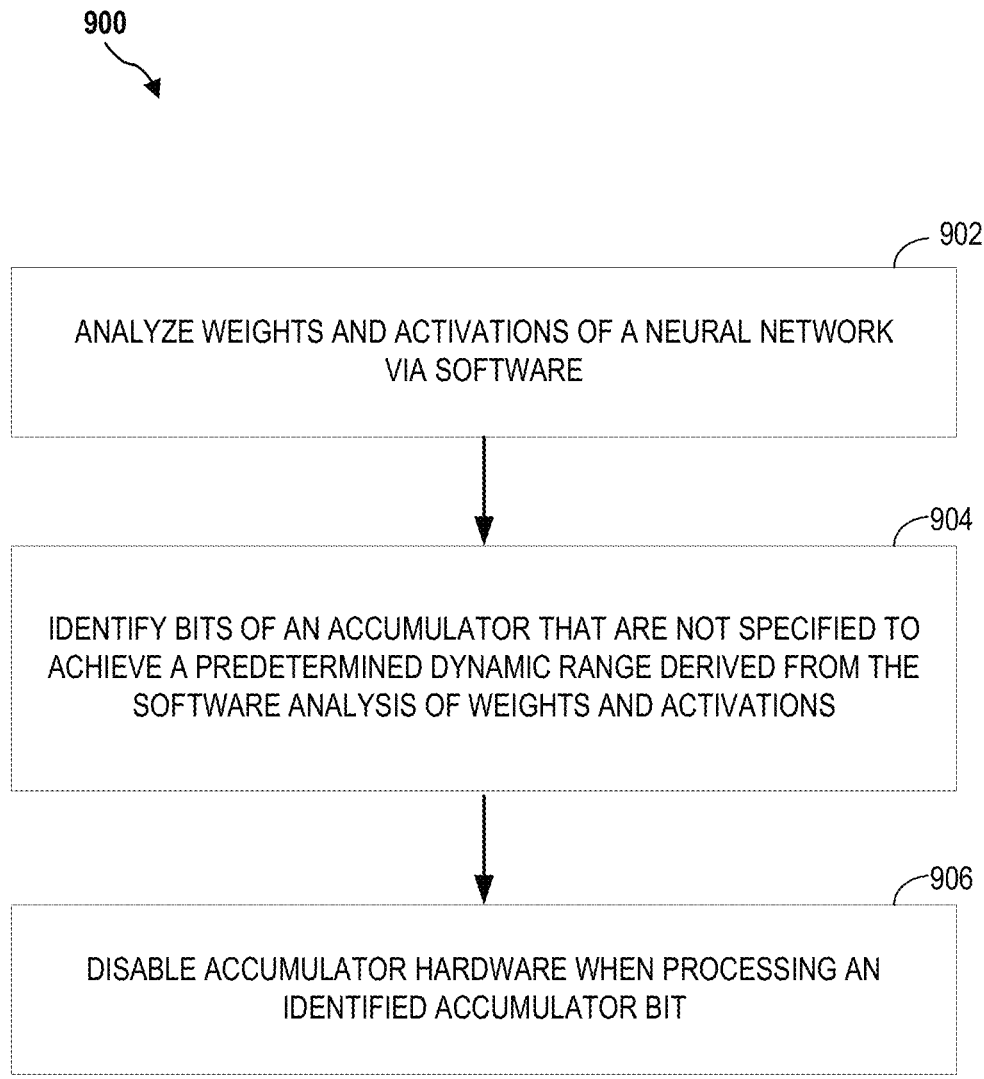
FIG. 9 illustrates a method of implementing a full accumulator size to support arbitrary calculations with full precision, according to aspects of the present disclosure.

FIG. 9 illustrates a method of implementing a full accumulator size to support arbitrary calculations with full precision, according to aspects of the present disclosure. A method 900 begins at block 902, in which weights and activations of a trained neural network are analyzed via software. At block 904, bits of an accumulator that are not specified to achieve a predetermined dynamic range derived from the software analysis of weights and activations are identified. At block 906, accumulator hardware is disabled when processing an identified accumulator bit. For example, accumulator hardware is configured to disable (e.g., clock gate) accumulator logic when processing one of the identified bits by clock gating accumulator logic when processing an identified accumulator bit. In one configuration, upstream and downstream logic attached to those accumulator bits is also disabled. This technique can save significant power versus enabling all accumulator bits and associated logic.

Another aspect of the disclosure consists of analyzing a number of trained neural network models to determine a smaller dynamic range that is suitable for all those networks, and then building the accumulator with only enough bits to support the largest accumulator dynamic range specified for those networks. In addition to saving even more power, this technique saves silicon area. Note that even in this case, a specific network can be analyzed to determine whether the dynamic range specific to that network is even more limited than the dynamic range of all networks analyzed so far. For such a network, additional bits of the hardware accumulator may be disabled, saving additional power.

In some aspects, the method 800 and the method 900 may be performed by the SOC 100 (FIG. 1). That is, each of the elements of the method 800 and/or the method 900 may, for example, but without limitation, be performed by the SOC 100 or one or more processors (e.g., CPU 102 and/or NPU 108) and/or other components included therein.

The model includes means for converting a fixed-point input value and means for constraining a dynamic range during the converting. In one aspect, the converting means and/or the constraining means may be the control logic 610/710, the shift block, the mask logic 620/720, the CPU 102, program memory associated with the CPU 102, memory block 118, the NPU 108 program memory associated with the NPU 108, the CPU 422, and/or the NPU 428 configured to perform the functions recited. A circuit also includes means for count a number of leading zeros and/or a number of leading ones of a fixed-point input value In one aspect, the counting means may be the CLZ/CLO block. In another configuration, the aforementioned means may be any module or any apparatus configured to perform the functions recited by the aforementioned means.

The various operations of methods described above may be performed by any suitable means capable of performing the corresponding functions. The means may include various hardware and/or software component(s) and/or module(s), including, but not limited to, a circuit, an application specific integrated circuit (ASIC), or processor. Generally, where there are operations illustrated in the figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database or another data structure), ascertaining and the like. Additionally, "determining" may include receiving (e.g., receiving information), accessing (e.g., accessing data in a memory) and the like. Furthermore, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general-purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, erasable programmable read-only memory (EPROM), electrically erasable programmable read-only memory (EEPROM), registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a device. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement signal processing functions. For certain aspects, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, random access memory (RAM), flash memory, read only memory (ROM), programmable read-only memory (PROM), erasable programmable read-only memory (EPROM), electrically erasable programmable Read-only memory (EEPROM), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the device, all which may be accessed by the processor through the bus interface. Alternatively, or in addition, the machine-readable media, or any portion thereof, may be integrated into the processor, such as the case may be with cache and/or general register files. Although the various components discussed may be described as having a specific location, such as a local component, they may also be configured in various ways, such as certain components being configured as part of a distributed computing system.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may comprise one or more neuromorphic processors for implementing the neuron models and models of neural systems described herein. As another alternative, the processing system may be implemented with an application specific integrated circuit (ASIC) with the processor, the bus interface, the user interface, supporting circuitry, and at least a portion of the machine-readable media integrated into a single chip, or with one or more field programmable gate arrays (FPGAs), programmable logic devices (PLDs), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module. Furthermore, it should be appreciated that aspects of the present disclosure result in improvements to the functioning of the processor, computer, machine, or other system implementing such aspects.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Additionally, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A processor-implemented method of constraining data represented in a deep neural network, comprising:
   determining, by a count leading zero/count leading one (CLZ/CLO) block, an initial shifting specified to convert a fixed-point input value to a floating-point output value;
   determining, by control logic, an additional shifting specified to constrain a dynamic range during converting of the fixed-point input value to the floating-point output value; and
   performing, by mask logic, both the initial shifting and the additional shifting together to form a dynamic, range constrained, normalized floating-point output value.

2. The method of claim 1, in which determining the initial shifting comprises:
   counting a number of leading zeros of the fixed-point input value; and
   counting a number of leading ones of the fixed-point input value.

3. The method of claim 1, further comprising shifting and masking bits of the fixed-point input value to form the dynamic, range constrained, normalized floating-point output value.

4. The method of claim 1, further comprising approximating a hyperbolic tangent (tanh) function and/or a sigmoid (sigm) function.

5. The method of claim 4, further comprising training the deep neural network using the tanh function and/or the sigm function.

6. The method of claim 1, in which the dynamic, range constrained, normalized floating-point output value is represented using a 16-bit floating-point (FP16) format.

7. A circuit to constrain a dynamic range of data represented in a deep neural network, the circuit comprising:
   CLZ/CLO logic configured to count a number of leading zeros and/or a number of leading ones of a fixed-point input value;
   a shift block configured to shift the fixed-point input value;
   mask logic; and
   control logic configured to control the shift block to convert the fixed-point input value to a floating-point output value according to at least the number of leading zeros and/or the number of leading ones of the fixed-point input value, and configured to control the mask logic to constrain a dynamic range during converting of the fixed-point input value to the floating-point output value to form a dynamic, range constrained, normalized floating-point output value.

8. The circuit of claim 7, in which the mask logic comprises:
   a logical-AND mask coupled to an output the control logic and an output of the shift block; and
   a logical-OR mask coupled to the output of the control logic and an output of the logical-AND mask.

9. The circuit of claim 8, in which the mask logic further comprises:
   a first XOR gate coupled to the output of the control logic and the output of the shift block and having an output coupled to the logical-AND mask;
   a multiplexer coupled to the output of the logical-AND mask and the output of the control logic to select a MUX output;
   a second XOR gate coupled to the output of the control logic and the MUX output to generate an XOR output; and
   an adder coupled to an output of the logical-OR mask and the XOR output to form the dynamic, range constrained, normalized floating-point output value.

10. The circuit of claim 9, in which the control logic is configured to receive an exponent value of the fixed-point input value.

11. A circuit to constrain a dynamic range of data represented in a deep neural network, the circuit comprising:
    means for count a number of leading zeros and/or a number of leading ones of a fixed-point input value;
    a shift block configured to shift the fixed-point input value;
    mask logic; and
    control logic configured to control the shift block to convert the fixed-point input value to a floating-point output value according to at least the number of leading zeros and/or the number of leading ones of the fixed-point input value, and configured to control the mask logic to constrain a dynamic range during converting of the fixed-point input value to the floating-point output value to form a dynamic, range constrained, normalized floating-point output value.

12. The circuit of claim 11, in which the mask logic comprises:
    a logical-AND mask coupled to an output the control logic and an output of the shift block; and
    a logical-OR mask coupled to the output of the control logic and an output of the logical-AND mask.

13. The circuit of claim 12, in which the mask logic further comprises:
    a first XOR gate coupled to the output of the control logic and the output of the shift block and having an output coupled to the logical-AND mask;
    a multiplexer coupled to the output of the logical-AND mask and the output of the control logic to select a MUX output; and
    a second XOR gate coupled to the output of the control logic and the MUX output to generate an XOR output.

14. The circuit of claim 13, in which the mask logic further comprises an adder coupled to an output of the logical-OR mask and the XOR output to form the dynamic, range constrained, normalized floating-point output value.

15. The circuit of claim 13, in which the control logic is configured to receive an exponent value of the fixed-point input value.

* * * * *